United States Patent
Yang et al.

(10) Patent No.: US 7,071,046 B2
(45) Date of Patent: Jul. 4, 2006

(54) METHOD OF MANUFACTURING A MOS TRANSISTOR

(75) Inventors: Neng-Hui Yang, Hsin-Chu (TW); Huan-Shun Lin, Tai-Chung (TW); Hsiang-Ying Wang, Chia-Yi Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,620

(22) Filed: Nov. 18, 2004

(65) Prior Publication Data

US 2006/0105511 A1    May 18, 2006

(51) Int. Cl.
*H01L 21/336*    (2006.01)
*H01L 21/8234*    (2006.01)

(52) U.S. Cl. .................. 438/197; 438/304; 438/525
(58) Field of Classification Search ........... 438/197, 438/285, 287, 300, 302, 304, 524, 525, 585
See application file for complete search history.

(56) References Cited

U.S. PATENT DOCUMENTS

| 6,372,583 | B1 | 4/2002 | Tyagi |
| 6,657,223 | B1 | 12/2003 | Wang et al. |
| 6,682,980 | B1 * | 1/2004 | Chidambaram et al. .... 438/302 |
| 2004/0072395 | A1 * | 4/2004 | Liu ........................... 438/197 |
| 2005/0032322 | A1 * | 2/2005 | Kim et al. .................. 438/301 |

* cited by examiner

*Primary Examiner*—Phuc T. Dang
(74) *Attorney, Agent, or Firm*—Winston Hsu

(57) ABSTRACT

A method of manufacturing a MOS transistor, comprising the steps of providing a semiconductor substrate, forming a gate structure on the semiconductor substrate, performing an implantation to form two implanted regions in the semiconductor substrate respectively adjacent to the gate structure, performing an etching process to remove each implanted region and form a trench, and performing a selective epitaxial growth to fill epitaxial crystal into the trenches, thereby forming a source/drain of the MOS transistor.

32 Claims, 10 Drawing Sheets

US 7,071,046 B2

METHOD OF MANUFACTURING A MOS TRANSISTOR

BACKGROUND OF INVENTION

1. Field of the Invention

The present invention relates to a method of manufacturing a semiconductor device, and more particularly, a method of manufacturing a MOS (metal-oxide-semiconductor) transistor.

2. Description of the Prior Art

The performance of Si semiconductor elements, in particular, MOSFETs, has increased year after year with the advance of large-scale integrated circuits (LSI). However, it has been recently pointed out that the miniaturization attained by lithographic technology has reached its limit, and that carrier mobility has almost reached theoretical mobility in Si. Under the circumstances, it is difficult to further improve the performance of MOSFETs. To attain higher performance of the semiconductor device, attempts have been made to use a strained silicon (Si) layer, which has been grown epitaxially on a Si wafer with a silicon germanium (SiGe) layer disposed therebetween, for the channel area. In this type of strained Si-FET, a biaxial tensile strain occurs in the silicon layer due to the SiGe which has a larger lattice constant than Si, and, as a result, the Si band structure alters, the degeneracy is lifted, and the carrier mobility increases. This enhances the speed performance of PMOS or NMOS devices.

Other attempts have been made to use germanium embedded in a source/drain region formed by selective epitaxial growth as a compressive strained silicon film to enhance electron mobility in a PMOS transistor. However, germanium doped into selective epitaxial silicon would damage hole mobility of a NMOS transistor. Thus, the doping of germanium into the selective epitaxial silicon during the manufacture of a PMOS device needs to be performed while NMOS devices on the same semiconductor substrate are not affected. The similar situation applies to the NMOS manufacturing. Carbon is embedded in a source/drain region formed by selective epitaxial growth as a tensile strained silicon film to enhance electron mobility in a NMOS transistor. Thus, the doping of carbon into the selective epitaxial silicon during the manufacture of NMOS devices needs to be performed while PMOS devices on the same semiconductor substrate are not affected. Thus, in a conventional technology, the NMOS/PMOS region is covered using an oxide layer as a mask during the processes of a source/drain trench pattern definition and is refilled with the selective epitaxial silicon in the manufacturing of the PMOS/NMOS devices. An etching process including dry etching and/or wet etching is used to define the source/drain trench pattern. For example, an anisotropic dry etching is performed and then an isotropic wet etching is performed to form source/drain trenches, as shown in FIG. 1. FIG. 1 shows a semiconductor substrate 10, a gate oxide layer 12, a gate 14, a spacer 16, and a cap layer 18. However, as the size for semiconductor device gets smaller, the reactants in the etching system or the ions with energy have difficulty in reaching the etching target or the products have difficulty in discharging, resulting in a reduced etching rate. This phenomenon is worsened as the etching area becomes smaller, which is called the micro loading effect. Especially when a source/drain trench pattern has both isolated and dense regions, it is difficult to accurately define the pattern as desired.

U.S. Pat. No. 6,372,583 discloses a method for making a semiconductor device. FIG. 2 briefly shows a schematic cross-sectional view at the process stage of removal of mask on the gate area. In the method, the intended source/drain region in a semiconductor substrate 10 is etched using a mask 28, an epitaxial growth process is performed to fill the first part of a trench (regions 20, 22), then an oxide is filled into the second part of the trench (regions 24, 26), and a gate is formed after the mask on the intended gate region is removed. Regions 30 are halo implanted regions. In this method, the removal of the source/drain region is attained by an anisotropic dry etching and an isotropic wet etching. Thus, this method may suffer from the micro-loading effect as described above.

Thus, a need exists to provide a method of manufacturing a MOS transistor to define the desired source/drain trench pattern in order to produce a MOS transistor with good performance.

SUMMARY OF INVENTION

Accordingly, an object of the present invention is to provide a method of manufacturing a MOS transistor, in which a source/drain trench profile is properly formed and refilled with epitaxial crystal, and thus a MOS transistor having a high mobility is manufactured.

The method of manufacturing a MOS transistor according to the present invention comprises the steps of providing a semiconductor substrate, forming a gate structure on the semiconductor substrate, performing an implantation to form two implanted regions in the semiconductor substrate respectively adjacent to the gate structure, performing an etching process to remove each implanted region and form a trench, and performing a selective epitaxial growth (SEG) to fill epitaxial crystal into the trenches, thereby forming a source/drain of the MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
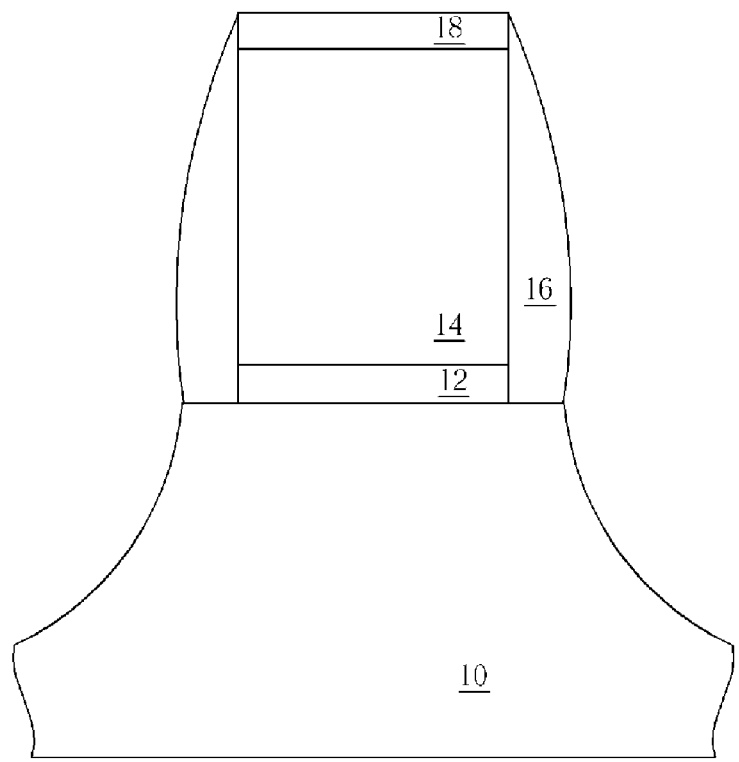
FIG. 1 is a schematic diagram showing a cross section after intended source/drain regions are removed by dry etching in a conventional technique.
Figure 2:
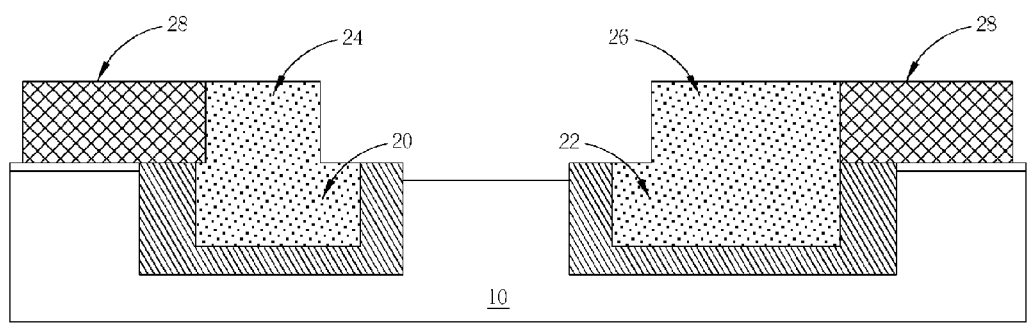
FIG. 2 is a schematic cross section diagram illustrating another conventional technique of manufacturing a semiconductor device.

Please refer to FIGS. 3 to 8 showing schematic cross-sectional diagrams illustrating a method of manufacturing a MOS transistor in accordance with one preferred embodiment of the present invention, wherein like number numerals designate similar or the same parts, regions or elements. It is to be understood that the drawings are not drawn to scale and are used only for illustration purposes. It is to be understood that some processes for forming a gate structure relating to the present invention method are known in the art and thus not explicitly shown in the drawings.

Figure 3:
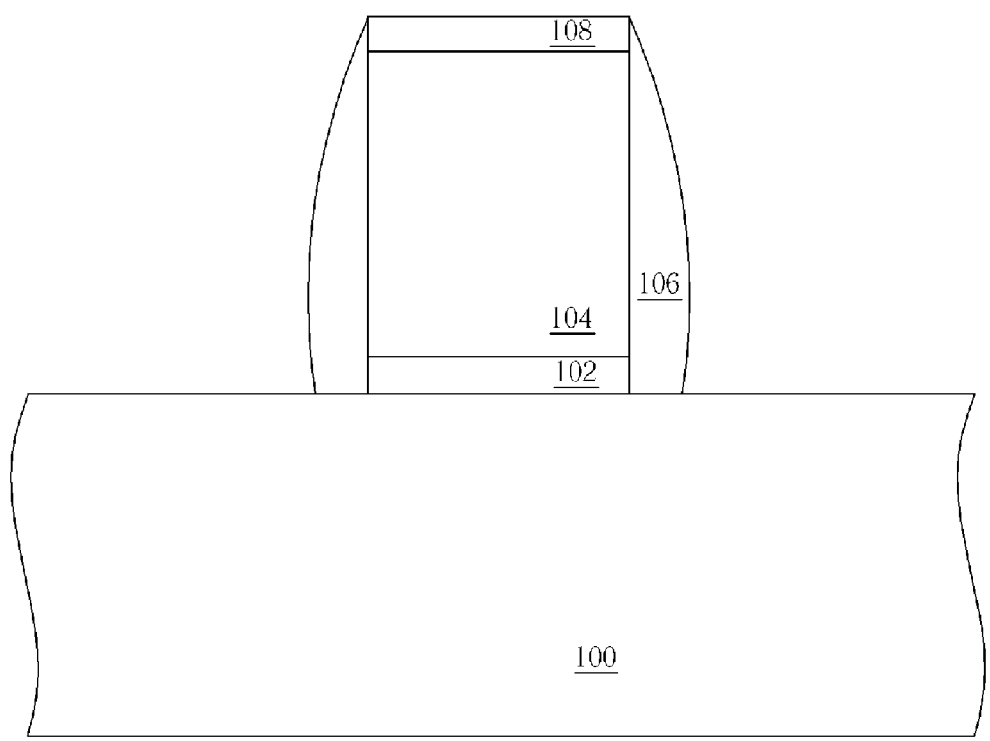
FIGS. 3 to 8 are schematic cross section diagrams illustrating the method of manufacturing a MOS transistor according to the present invention.

At first, as shown in FIG. 3, a semiconductor substrate 100, such as silicon substrate, is provided. At least a gate structure 104 is formed on the semiconductor substrate 100. The gate structure may comprise a polysilicon gate. A gate insulating layer 102 comprising, for example, silicon oxide may be formed between the gate structure 104 and the semiconductor substrate 100 by a thermal oxidization process or a deposition process. A cap layer 108 may be formed on the top surface of the gate structure 104. The cap layer may be a silicon nitride layer or a polycide layer with which the gate structure 104 is protected. A spacer 106 is formed alongside each gate structure by entirely depositing a silicon oxide layer or a silicon nitride layer on the substrate 100 and the gate structures 104, and performing an etching back process. Alternatively, an ONO (oxide-nitride-oxide) layer may be formed to cover the gate structure 104 and serves as a spacer for protection in the subsequent implantation or etching process.

Figure 4:
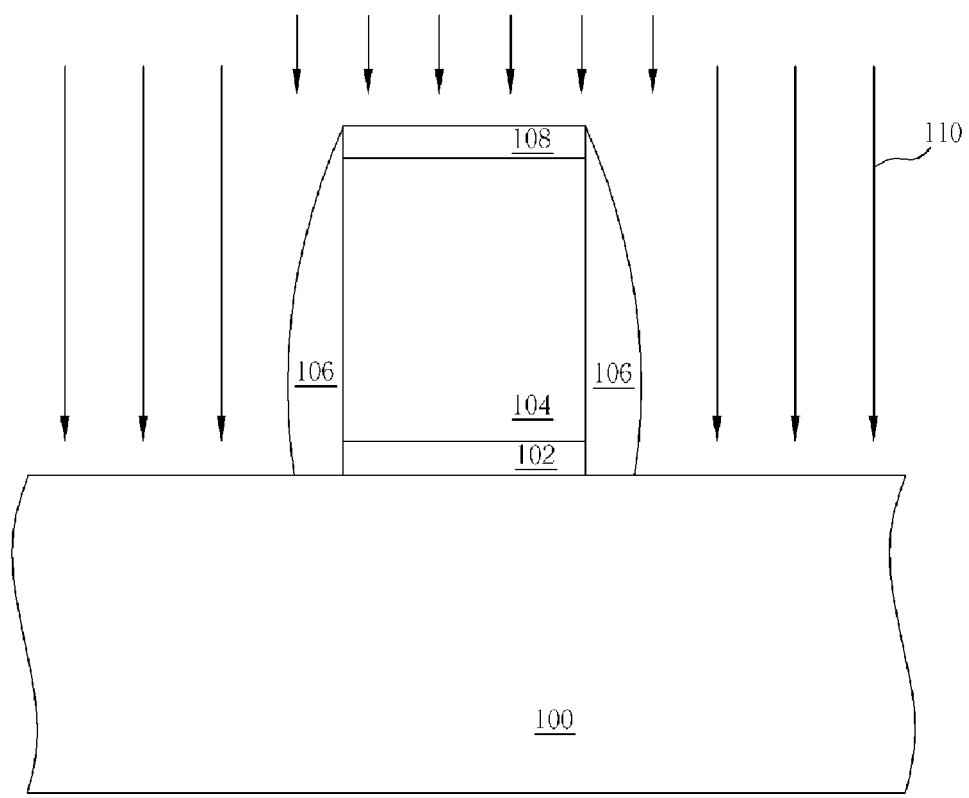
Figure 5:
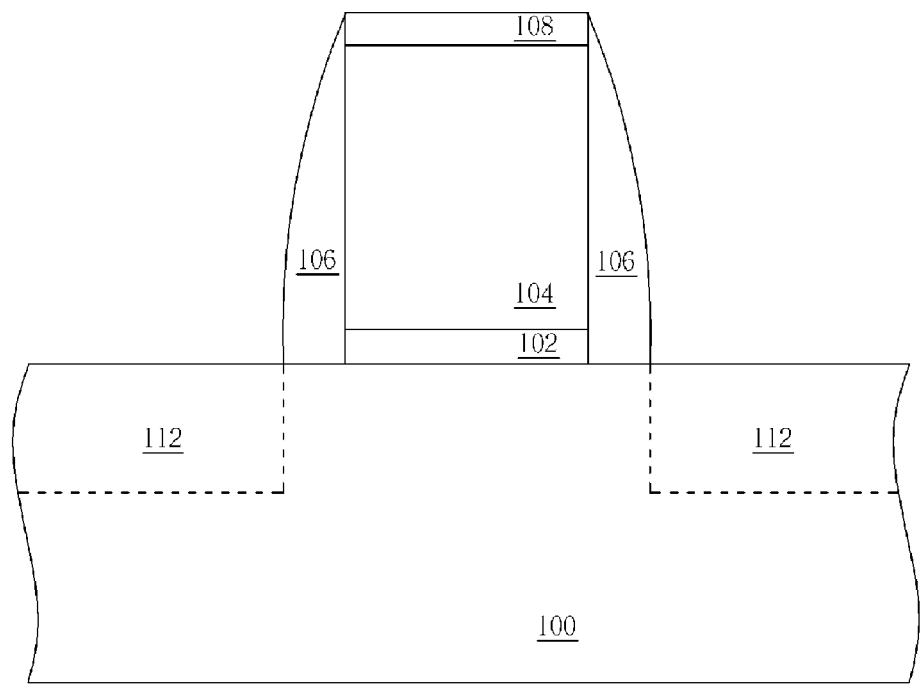

Next, as shown in FIG. 4, an implantation process is performed to implant a dopant 110 into predetermined source/drain regions in the semiconductor substrate 100 between the gate structures 104 to form an implanted region 112, as shown in FIG. 5. The dopant implanted can destroy the semiconductor substrate crystal structure, resulting an amorphous structure favorably removed in virtue of the removing selectivity of amorphous structures to crystalline structures. Alternatively, the dopant implantation can cause the implanted region 112 to change its chemical structure and an etchant can be properly chosen to remove the implanted region 112. The dopant used can be any species having the desired function that is allowable to be used in the manufacturing process, for example, the atom or an ion of boron (B), germanium (Ge), arsenic (As), phosphorus (P), antimony (Sb), or xenon (Xe). In the implantation process, a preamorphizing implantation (PAI) may be performed at first using germanium as a dopant, and then an implantation of arsenic is performed to form an amorphized implanted region. A tilt angle implantation can be used during the implantation, thus the implanted region formed can extend to beneath the gate or the spacers positioned besides the gate electrode, and the channel length can be reduced.

Figure 6:
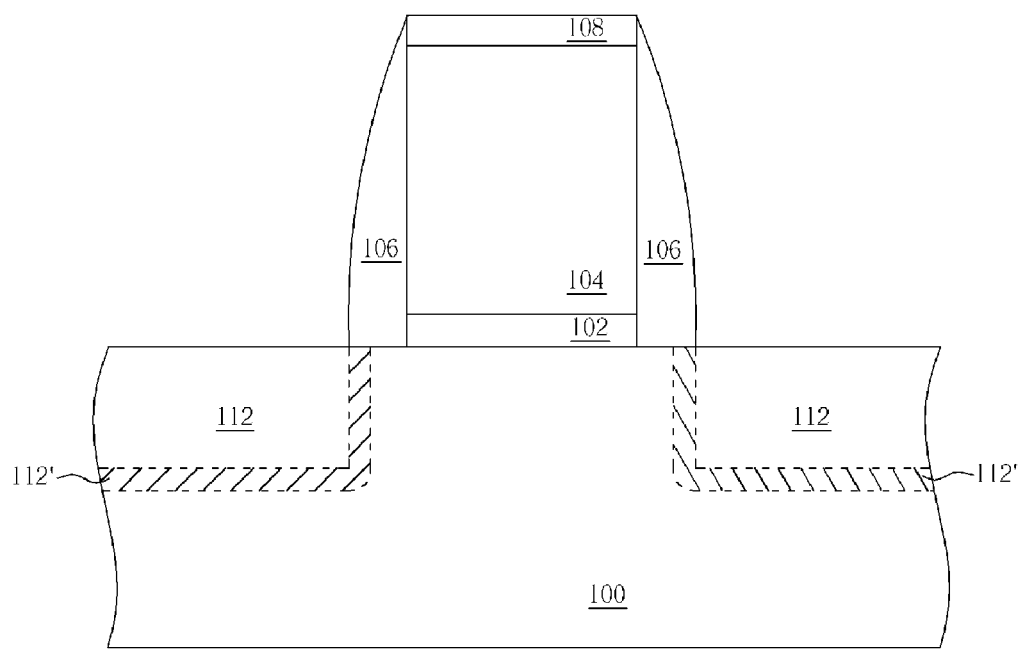

After the implantation, a spiking annealing may be performed, for example, a rapid thermal process (RTP) at a temperature between 1070 and 1100° C. for a few or several seconds. The dopant in the implanted region will diffuse outward and the profile of the implanted region gets bigger but does not lose the original profile after the implantation. As shown in FIG. 6, region 112' schematically represents the diffusion region. The annealing process extends the ambit of the implanted regions, and in turn reduces the channel length.

Accordingly, in the method of the present invention, the profile and the size of regions 112 can be controlled by selecting the implanting species, implanting dosage, implanting energy, implanting tilt angle, annealing temperature, or annealing time.

As it is noted, when an As implantation is used to define the source/drain contour, a thick oxide layer is preferably used as a hard mask to prevent the polysilicon of the gate from being implanted with As.

Figure 7:
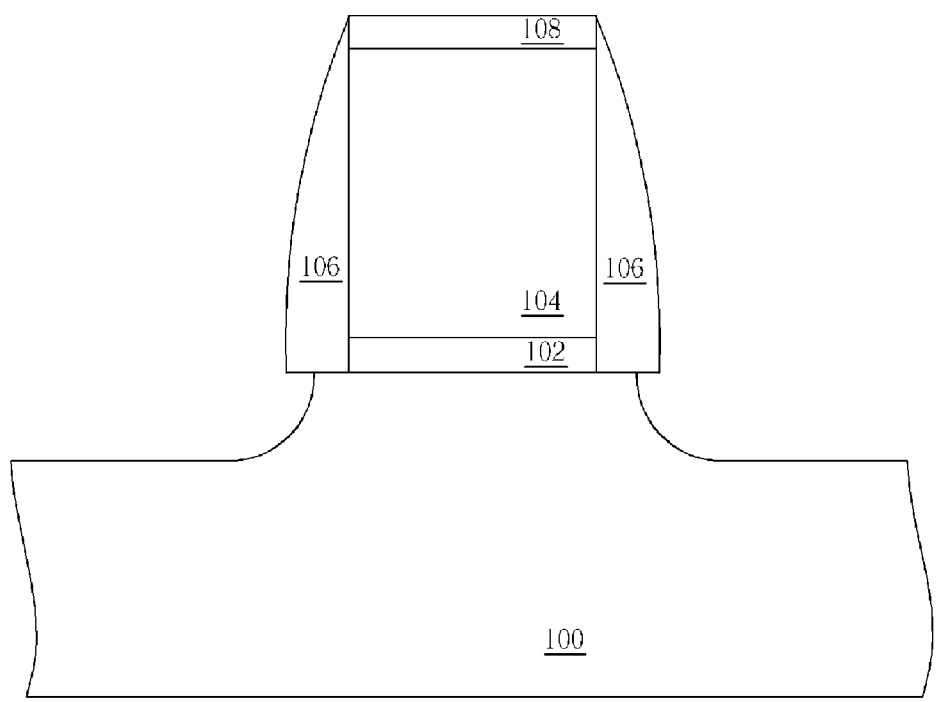

Next, referring to FIG. 7, an etching process is performed to remove the implanted regions 112, forming trenches as a source/drain trench profile. Because the implanted regions 112 have been implanted and have different structure from the unimplanted regions, thus a proper etching process can be found to remove substance in the implanted regions 112 easily and conform to the implanted region contour to form a desired trench. For example, an etching process having a high selectivity of high doping region to low doping region or amorphous silicon to crystalline silicon may be used. The trench shape and size are relative to the shape and size of the implanted region 112 which have been easily controlled by parameters. The etching process may be a wet etching or a dry etching process. In the case that Ge preamorphizing implantation and As implantation are performed to the implanted region 112, it is proper to use hot phosphoric acid solution as an etchant to perform a wet etching process. In the case that B implantation is performed, a solution of $HF/HNO_3/CH_3COOH$ (about 1:3:8) or a solution with about 0.4 mole/L of HF and about 11 mole/L of $HNO_3$ may be used as an etchant. With respect to amorphous silicon, an etchant of KOH/IPA (isopropyl alcohol) can be used.

As it is noted, the micro loading effect does not occur in the present invention because the implantation process is not affected by the iso/dense pattern, even during the etching process after the implantation process. Therefore, the size and shape, including the depth, of the source/drain trench can be well controlled.

After the source/drain trench is formed, a halo implantation may be performed with B ions or $BF_2$ ions.

Figure 8:
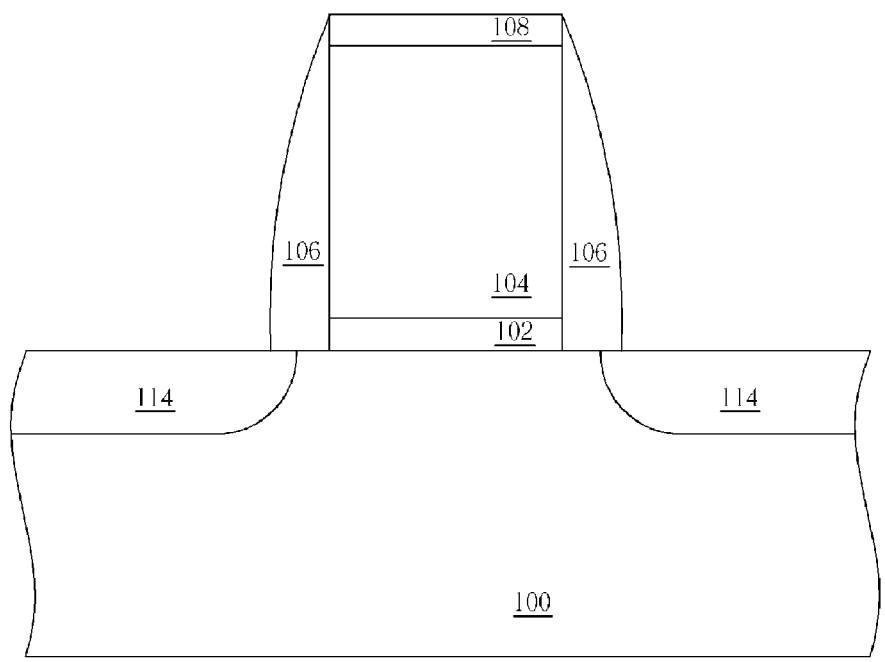

Referring to FIG. 8, a selective epitaxial growth is performed to fill epitaxial crystal into the trenches to form the source/drain 114 of the MOS transistor, respectively. The epitaxial Si and Ge and p-type dopant may be filled when the PMOS is manufactured. The mole concentration of Ge based on the total amount of silicon and Ge is between about 10% to about 30%, preferably about 25%. The epitaxial Si and carbon and n-type dopant may be filled when the NMOS is manufactured. The mole concentration of carbon based on the total amount of silicon and carbon is between about 0.5% to about 4%, preferably about 1.5%. When silicon and germanium or carbon are filled by epitaxial growth, the content of germanium or carbon will be more than the content of germanium or carbon filled in the silicon substrate by the conventional implantation, thus causing a channel strain to enhance the hole or electron mobility. The silicon and germanium epitaxial growth may be performed using dichlorosilane ($SiH_2Cl_2$, DCS) and $GeH_4$ as a Si and Ge source by low pressure chemical vapor deposition (LPCVD) method at a temperature between 500 and 800° C. and under a low pressure. The silicon and carbon epitaxial growth may be performed using $SiH_4$ and $SiH_3CH_3$ as a Si and C source by LPCVD method at a temperature between 500 and 800° C. and under a low pressure. The dopants needed in a source/drain can be doped with or after the epitaxial growth.

Figure 9:
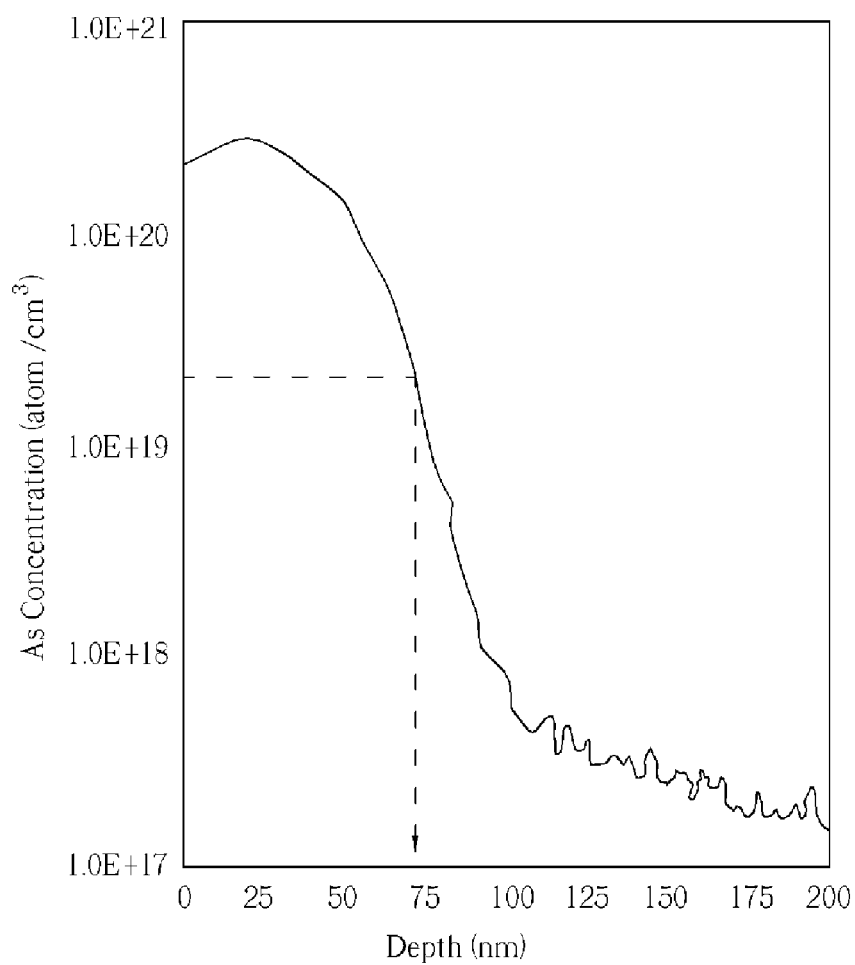
FIG. 9 is a SIMS graph obtained from the measurement of the intended source/drain region after an arsenic implantation and RTP in the method of manufacturing a MOS transistor according to the present invention.
Figure 10:
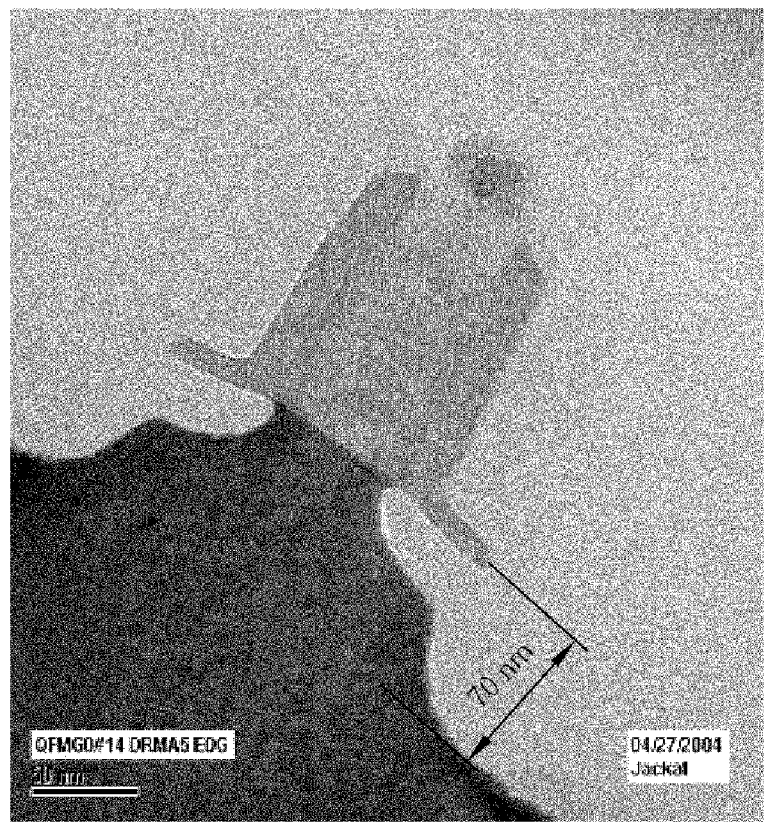
FIG. 10 is a scanning electron micrograph for the semiconductor substrate after the intended source/drain regions are formed according to the present invention.

In an embodiment according to the present invention, a gate structure is formed on an n-type semiconductor substrate, comprising a gate oxide layer and a polysilicon gate, an oxide layer as a cap layer, and an ONO layer along side of the gate structure. Then, Ge preamorphizing implantation is performed with an implanting energy of 40 keV and implanting dosage of $5.0 \times 10^{14}$ atoms/$cm^2$, and As implantation is performed with an implanting energy of 40 keV and implanting dosage of $3.0 \times 10^{15}$ atoms/$cm^2$. Then, an RTP is performed for annealing. The relation of concentration and depth of As in the intended source/drain region obtained is shown in FIG. 9, a graph of secondary ion mass spectrometry (SIMS). It shows the As implanting concentration relating to the implanted region contour is well controlled. Then, a wet etching process is performed using hot phosphorus acid at 160° C. for 10 minutes to remove amorphous silicon doped with high concentration of As. The etching is stopped when the concentration of As less than $2 \times 10^9$ atoms/$cm^3$. As shown in FIG. 9, the concentration of As is $2 \times 10^9$ atoms/$cm^3$ at the depth of 70 nm in the semiconductor substrate. FIG. 10 shows a scanning electron micrograph for the semiconductor substrate after the intended source/drain regions are formed after the etching with hot phosphorus acid according to the present invention. The profile of the source/drain is well controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a MOS transistor, comprising:
    providing a semiconductor substrate;
    forming a gate structure on the semiconductor substrate;
    forming an oxide-nitride-oxide (ONO) offset spacer on each sidewall of the gate structure;
    performing an implantation process to form two implanted regions in the semiconductor substrate respectively adjacent to the oxide-nitride-oxide (ONO) offset spacers;
    performing an etching process to remove each implanted region and form a trench; and
    performing a selective epitaxial growth to fill epitaxial crystal into the trenches, thereby forming a source and a drain of the MOS transistor.

2. The method of claim 1 wherein the gate structure comprises a gate oxide and a gate electrode on the gate oxide, and a cap layer is formed on the top surface of the gate electrode.

3. The method of claim 1 wherein a dopant selected from the atom or an ion of boron, germanium, arsenic, phosphorus, antimony, or xenon is used in the implantation process.

4. The method of claim 1 wherein the implantation process comprises a preamorphizing implantation to amorphize the implanted regions.

5. The method of claim 1 wherein the implantation process is a tilt-angle implantation process and the trench is partly beneath the oxide-nitride-oxide offset spacer.

6. The method of claim 1, after the implantation process, further comprising a step of annealing.

7. The method of claim 6 wherein a profile of the source and the drain of the MOS transistor is controlled by an implanting species, implanting dosage, implanting energy, implanting tilt angle, annealing temperature, or annealing time.

8. The method of claim 6 wherein the annealing comprises rapid thermal processing at a temperature between 1070° C. and 1100° C.

9. The method of claim 1 wherein the etching process is a wet etching process.

10. The method of claim 9 wherein a hot phosphoric acid solution is used as an etchant in the wet etching process.

11. The method of claim 1 wherein the etching process is a dry etching process.

12. The method of claim 1 wherein the epitaxial crystal comprises at least one of silicon and germanium.

13. The method of claim 1 wherein the epitaxial crystal comprises at least one of silicon and carbon.

14. The method of claim 1 wherein the epitaxial crystal further comprises a dopant.

15. The method of claim 12 wherein the MOS transistor is a PMOS transistor.

16. The method of claim 13 wherein the MOS transistor is a NMOS transistor.

17. A method of forming source/drain regions in a semiconductor device, comprising:
    providing a semiconductor substrate having predetermined source/drain regions;
    performing an implantation process to form implanted regions in the predetermined source/drain regions;
    performing an etching process to remove the implanted regions and form trenches; and
    performing a selective epitaxial growth to fill epitaxial crystal comprising at least one of silicon, germanium, and carbon into the trenches.

18. The method of claim 17 wherein a dopant selected from the atom or an ion of boron, germanium, arsenic, phosphorus, antimony, or xenon is used in the implantation process.

19. The method of claim 17 wherein the implantation process comprises a preamorphizing implantation to amorphize the predetermined source/drain regions.

20. The method of claim 17, after the implantation process, further comprising a step of annealing.

21. The method of claim 17 wherein a profile of the source/drain regions is controlled by an implanting species, implanting dosage, implanting energy, implanting tilt angle, annealing temperature, or annealing time.

22. The method of claim 20 wherein the annealing comprises rapid is thermal processing at a temperature between 1070° C. and 1100° C.

23. The method of claim 17 wherein the etching process is a wet etching process.

24. The method of claim 23 wherein a hot phosphoric acid solution is used as an etchant in the wet etching process.

25. The method of claim 17 wherein the etching process is a dry etching process.

26. The method of claim 17 wherein the epitaxial crystal further comprises a dopant.

27. A method of manufacturing a MOS transistor, comprising:
    providing a semiconductor substrate;
    forming a gate structure on the semiconductor substrate;
    performing an implantation process to form two implanted regions in the semiconductor substrate respectively adjacent to the gate structure;
    performing an etching process to remove each implanted region and form a trench; and
    performing a selective epitaxial growth to fill epitaxial crystal comprising at least one of silicon, carbon, and germanium into the trenches, thereby forming a source and a drain of the MOS transistor.

28. The method of claim 27 wherein an oxide-nitride-oxide (ONO) offset spacer is formed on each sidewall of the gate structure, the implantation process is a tilt-angle implantation process and the trench is partly beneath the oxide-nitride-oxide offset spacer.

29. The method of claim 27, after the implantation process, further comprising a step of annealing.

30. The method of claim 29 wherein a profile of the source/drain of the MOS transistor is controlled by an implanting species, implanting dosage, implanting energy, implanting tilt angle, annealing temperature, or annealing time.

31. The method of claim 27 wherein the etching process is a wet etching process.

32. The method of claim 31 wherein a hot phosphoric acid solution is used as an etchant in the wet etching process.

* * * * *